(12) United States Patent
Kodama

(10) Patent No.: US 10,224,319 B2
(45) Date of Patent: Mar. 5, 2019

(54) SEMICONDUCTOR DEVICE

(71) Applicant: Renesas Electronics Corporation, Tokyo (JP)

(72) Inventor: Eisuke Kodama, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 6 days.

(21) Appl. No.: 15/658,688

(22) Filed: Jul. 25, 2017

(65) Prior Publication Data

US 2018/0090480 A1    Mar. 29, 2018

(30) Foreign Application Priority Data

Sep. 26, 2016 (JP) .................................. 2016-186833

(51) Int. Cl.
| | | |
|---|---|---|
| *H01L 27/02* | (2006.01) | |
| *H01L 29/861* | (2006.01) | |
| *H01L 29/40* | (2006.01) | |
| *H01L 29/417* | (2006.01) | |
| *H01L 29/06* | (2006.01) | |

(52) U.S. Cl.
CPC ........ *H01L 27/0259* (2013.01); *H01L 29/417* (2013.01); *H01L 29/861* (2013.01); *H01L 29/0619* (2013.01); *H01L 29/402* (2013.01); *H01L 29/41708* (2013.01)

(58) Field of Classification Search
CPC ........... H01L 27/0259; H01L 29/41708; H01L 29/402; H01L 29/6634; H01L 29/7398; H01L 29/42304
USPC ......... 257/378, 197, 200, 565, 76, 526, 139, 257/607, 577, 328, 530, 355, 48, 111; 438/21, 363, 331, 234, 655
See application file for complete search history.

(56) References Cited

U.S. PATENT DOCUMENTS 6,188,123 B1 * 2/2001 Tsukamoto ....... H01L 23/49562
257/565

FOREIGN PATENT DOCUMENTS

JP    06-232386 A    8/1994

* cited by examiner

*Primary Examiner* — Moin Rahman
(74) *Attorney, Agent, or Firm* — Mattingly & Malur, PC

(57) ABSTRACT

An electrostatic protection element whose electrostatic breakdown resistance can be adjusted with a required minimum design change is provided.

A semiconductor device includes an electrostatic protection element including a bipolar transistor whose base region and emitter region are electrically coupled together through a resistance region. At this time, the base region of the electrostatic protection element has a side including a facing portion that faces the collector region. The facing portion of the side includes an exposed portion that is exposed from an emitter wiring in plan view and a covered portion that is covered by the emitter wiring in plan view.

12 Claims, 9 Drawing Sheets

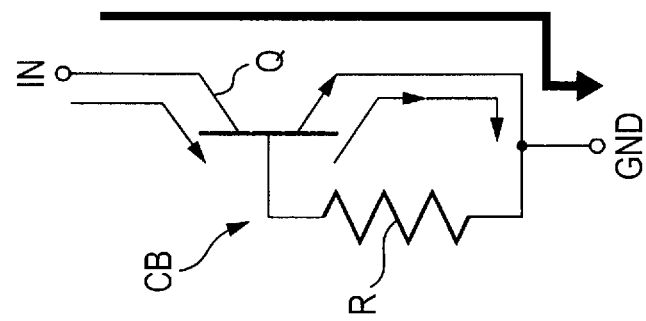
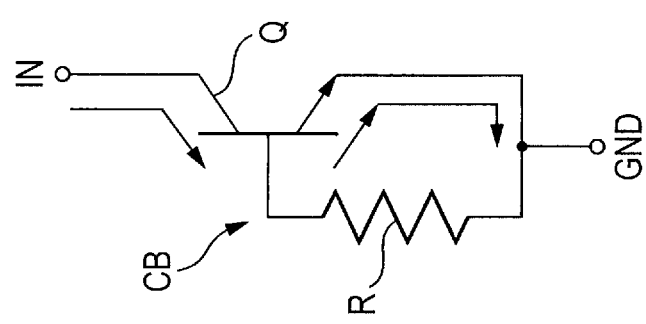
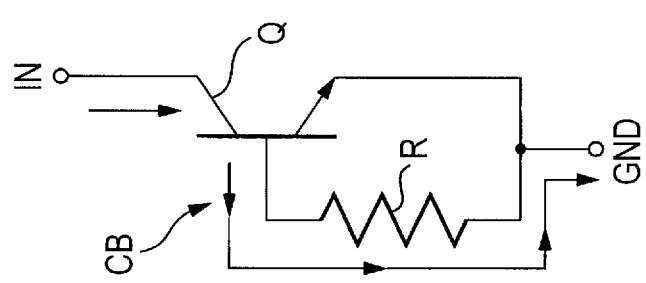
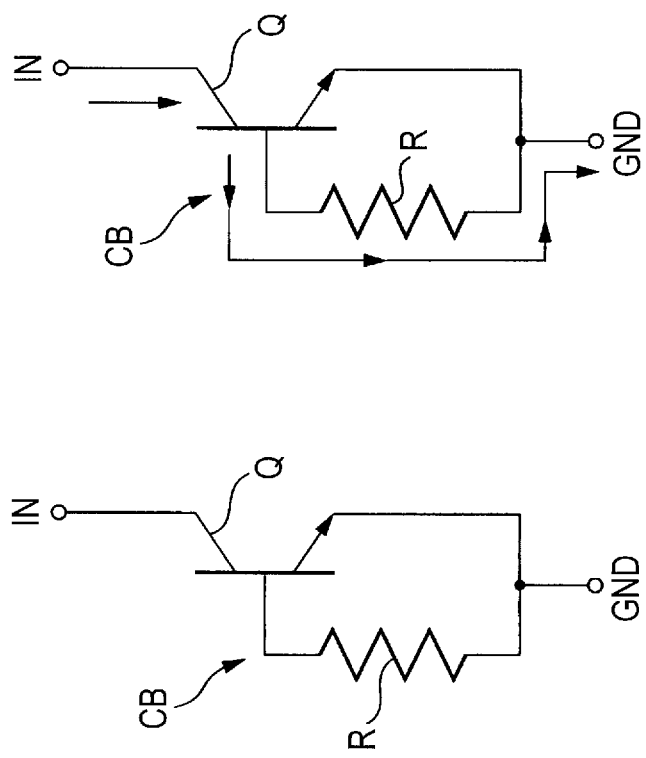

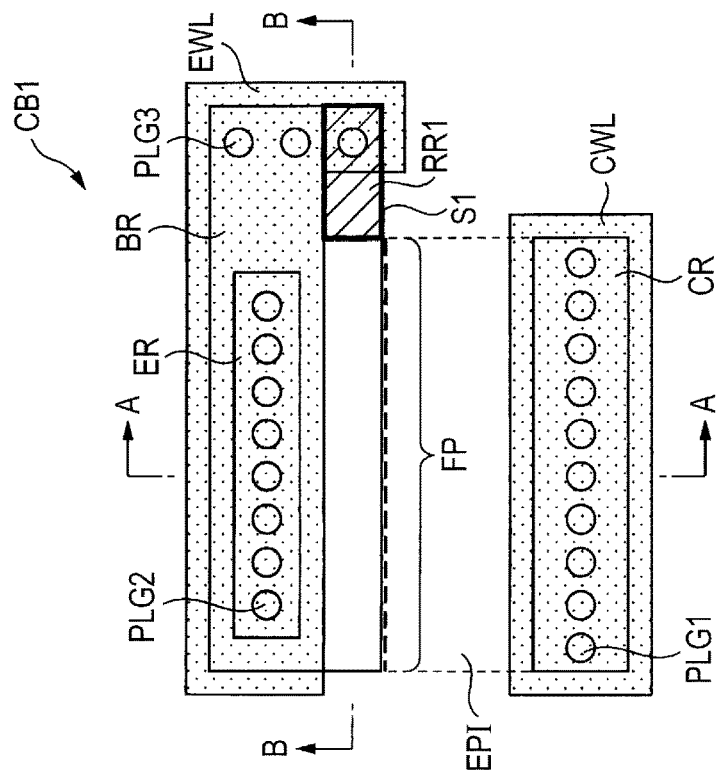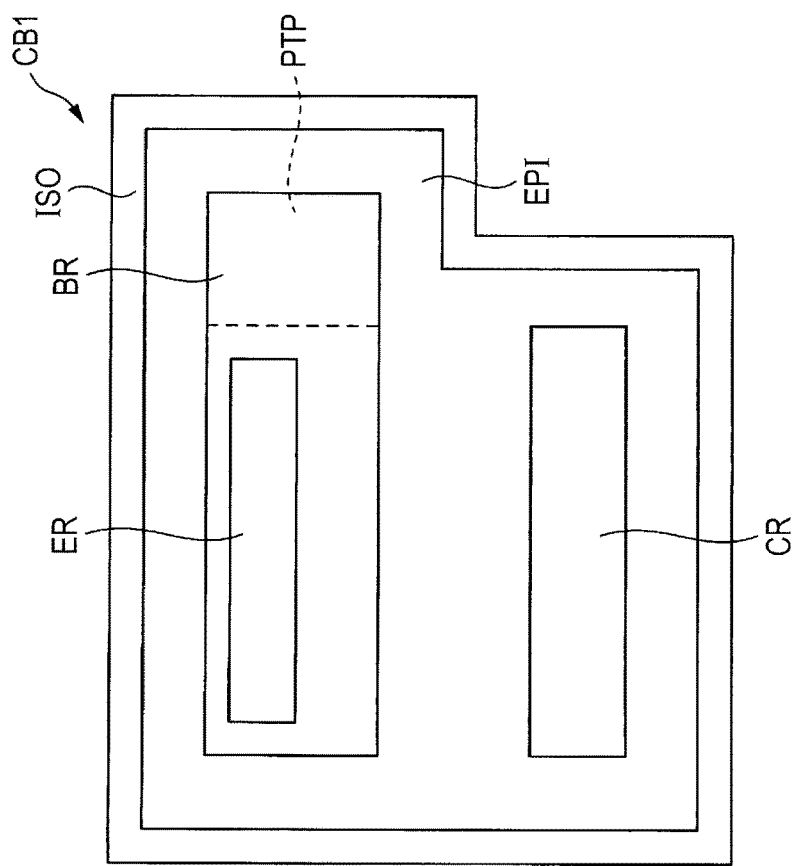

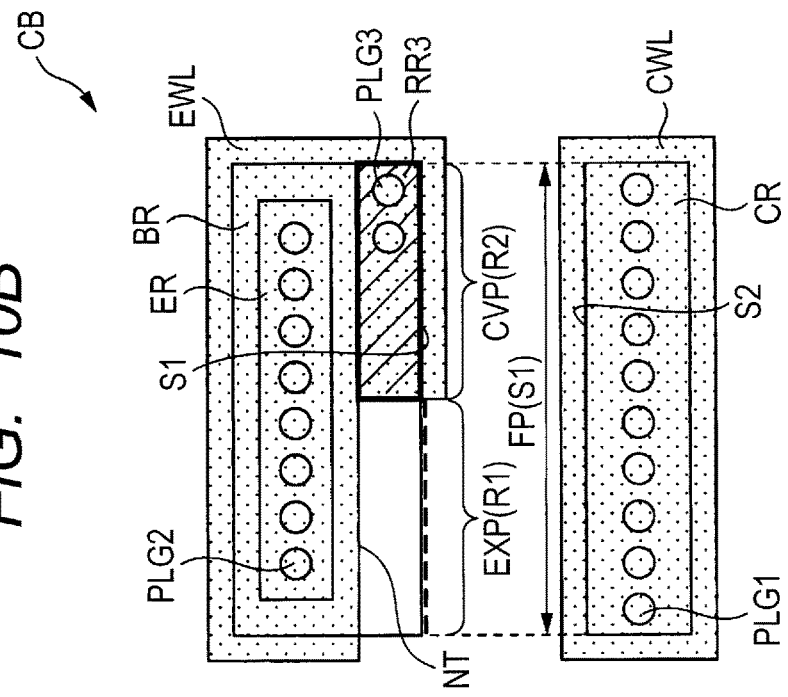
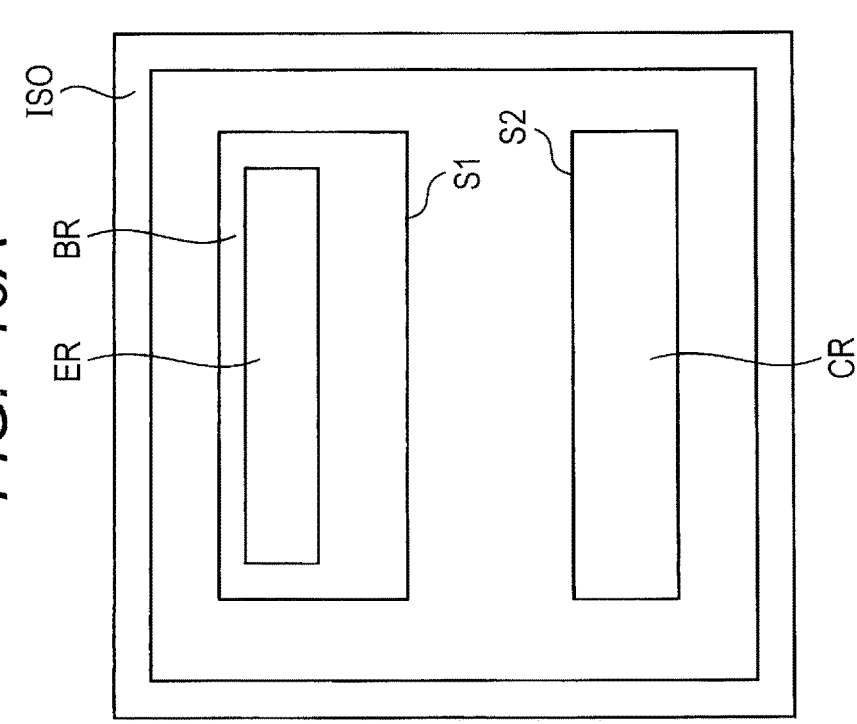

SEMICONDUCTOR DEVICE

CROSS-REFERENCE TO RELATED APPLICATIONS

The disclosure of Japanese Patent Application No. 2016-186833 filed on Sep. 26, 2016 including the specification, drawings and abstract is incorporated herein by reference in its entirety.

BACKGROUND

The present invention relates to a semiconductor device. For example, the invention relates to a technique effective when applied to a semiconductor device having an electrostatic protection element.

Japanese Unexamined Patent Application Publication No. Hei 06(1994)-232386 describes a technique in which a semiconductor chip is prevented from being broken by alleviating an electric field by increasing a width of a field plate extending from a pn junction portion of the semiconductor chip to greater than that extending from a straight portion of the semiconductor chip in a corner portion of the semiconductor chip.

SUMMARY

A semiconductor device is required to have an electrostatic breakdown resistance to prevent itself from being broken by static electricity. For this reason, the semiconductor device is provided with an electrostatic protection element in order to improve the electrostatic breakdown resistance.

Here, a design change of the electrostatic protection element of the semiconductor device may be required to be performed to adjust the electrostatic breakdown resistance. In this case, much labor and time are required to design again the electrostatic protection element from the beginning, so that a structure of the electrostatic protection element whose electrostatic breakdown resistance can be adjusted with a required minimum design change is desired.

The other problems and novel features will become apparent from the description of the present specification and the accompanying drawings.

A semiconductor device according to an embodiment includes an electrostatic protection element including a bipolar transistor whose base region and emitter region are electrically coupled together through a resistance region. At this time, the base region of the electrostatic protection element has a first side including a facing portion that faces the collector region. The facing portion of the first side includes an exposed portion that is exposed from an emitter wiring in plan view and a covered portion that is covered by the emitter wiring in plan view.

According to the embodiment, it is possible to provide an electrostatic protection element whose electrostatic breakdown resistance can be adjusted with a required minimum design change.

BRIEF DESCRIPTION OF THE DRAWINGS

FIG. 3A is a diagram for explaining a circuit operation of the electrostatic protection element in a segment between A and B shown in FIG. 2. FIG. 3B is a diagram for explaining a circuit operation of the electrostatic protection element in a segment between B and C shown in FIG. 2. FIG. 3C is a diagram for explaining a circuit operation of the electrostatic protection element in a segment between C and D shown in FIG. 2. FIG. 3D is a diagram for explaining a circuit operation of the electrostatic protection element in a segment between D and E shown in FIG. 2.

FIG. 4A is a schematic plan view showing components formed in a semiconductor substrate among components of an electrostatic protection element according to a related art. FIG. 4B is a schematic plan view showing not only the components formed in the semiconductor substrate but also components including a wiring layer formed over the semiconductor substrate.

FIG. 10A is a schematic plan view showing components formed in a semiconductor substrate among components of an electrostatic protection element according to a second embodiment. FIG. 10B is a schematic plan view showing components including also a wiring layer formed over the semiconductor substrate.

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

<Circuit Configuration of Electrostatic Protection Element>

An electrostatic protection element according to the first embodiment is assumed to be a "CB diode" including a bipolar transistor whose base and emitter are electrically coupled together through a resistor. According to the "CB diode", it is possible to flow charged electric charge to the ground by a large collector current, so that it is possible to obtain advantages that electrostatic breakdown resistance can be improved and a rise in voltage based on the charged electric charge is suppressed because of snapback phenomenon.

Figure 1:
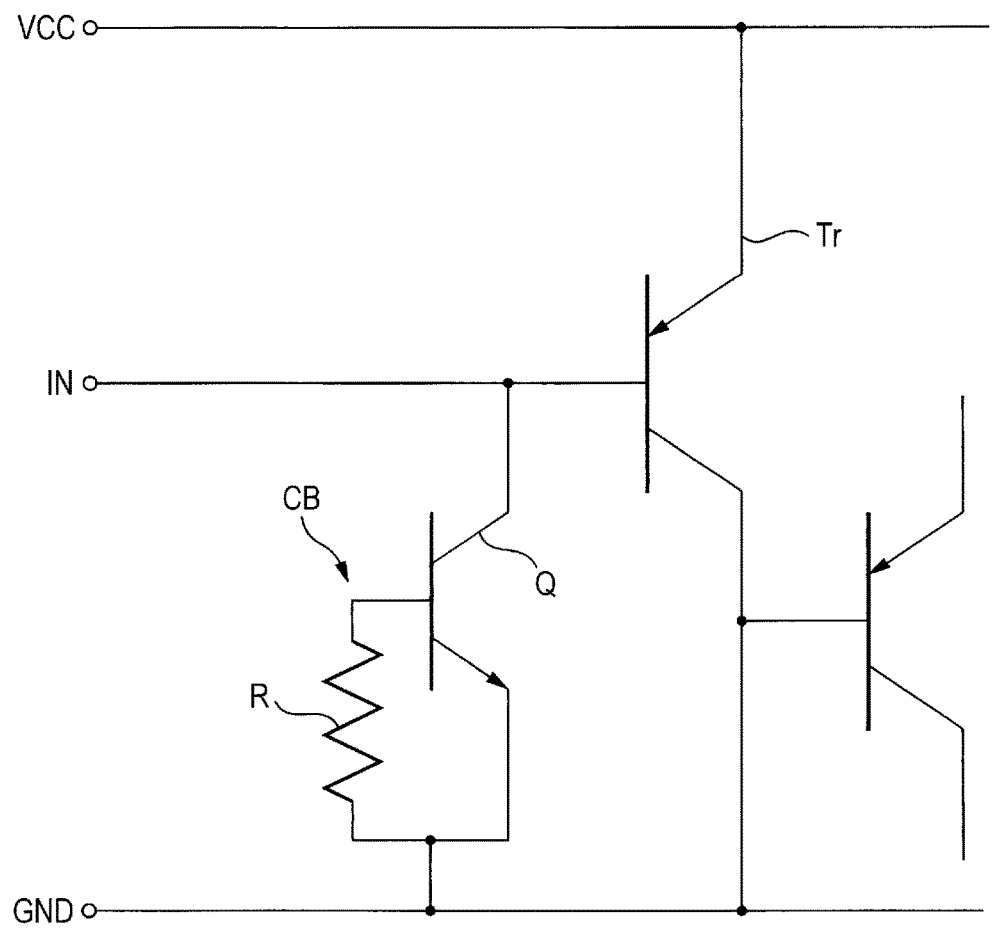
FIG. 1 is a circuit diagram showing a circuit configuration example in which an electrostatic protection element according to a first embodiment is provided in a previous stage of an input transistor.

FIG. 1 is a circuit diagram showing a circuit configuration example in which an electrostatic protection element CB according to the first embodiment is provided in a previous stage of an input transistor Tr. As shown in FIG. 1, the input transistor Tr including, for example, a PNP bipolar transistor is provided between a power supply terminal VCC to which a power supply potential is supplied and a ground terminal GND to which a ground potential (reference potential) is supplied. Specifically, the emitter of the input transistor Tr is electrically coupled to the power supply terminal VCC and the collector of the input transistor Tr is electrically coupled to the ground terminal GND. The base of the input transistor Tr is electrically coupled to an input terminal IN to which a signal is inputted.

Next, the electrostatic protection element CB according to the first embodiment is provided in a previous stage of the input transistor Tr. Specifically, the electrostatic protection element CB according to the first embodiment is formed of a "CB diode" using, for example, an NPN bipolar transistor Q. The collector of the NPN bipolar transistor Q that includes the electrostatic protection element CB is electrically coupled to the input terminal IN and the emitter of the NPN bipolar transistor Q is electrically coupled to the ground terminal GND. On the other hand, the base of the NPN bipolar transistor Q is electrically coupled to the ground terminal GND through an intentionally provided resistor R. Therefore, the emitter and the base of the NPN bipolar transistor Q that includes the electrostatic protection element CB are electrically coupled together through the resistor R, and thereby the electrostatic protection element CB including the "CB diode" is formed.

<Circuit Operation of Electrostatic Protection Element>

Figure 2:
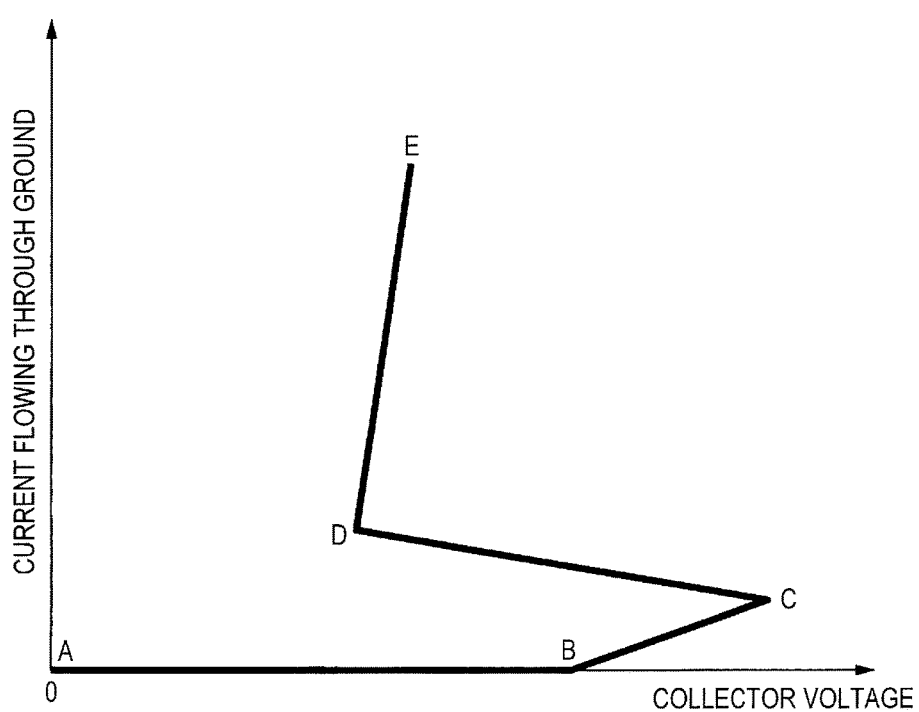
FIG. 2 is a graph showing a waveform obtained by a TLP measuring instrument.

Subsequently, an operation of the electrostatic protection element CB according to the first embodiment will be described. In particular, in the first embodiment, an operation of the electrostatic protection element CB when a plus surge charge enters the input terminal IN shown in FIG. 1 will be described. The operation of the electrostatic protection element CB when a plus surge charge enters the input terminal IN will be described based on a waveform obtained by a TLP (Transmission LINE Pulse) measuring instrument. FIG. 2 is a graph showing the waveform obtained by the TLP measuring instrument. In FIG. 2, the horizontal axis indicates a collector voltage of the electrostatic protection element CB and the vertical axis indicates a current flowing through the ground. The waveform obtained by the TLP measuring instrument is a waveform obtained by monitoring a collector voltage applied to the collector and a current flowing from the collector to the ground by applying a plus surge charge to the collector while gradually increasing the plus surge charge by a 250 ns pulse. In particular, a current value flowing from the collector to the ground indicated by the vertical axis means a capacity for flowing the plus surge charge entering the input terminal IN from the input terminal IN to the ground terminal GND. That is, it means that the greater the current value flowing from the collector to the ground is, the higher the capacity of the electrostatic protection element CB that flows the plus surge charge entering the input terminal IN to the ground is. In other words, it means that the greater the current value flowing from the collector to the ground is, the more the electrostatic breakdown resistance of the electrostatic protection element CB can be improved, and thereby it is possible to effectively protect the input transistor Tr shown in FIG. 1 from electrostatic breakdown.

(1) Operation in a Segment Between A and B in FIG. 2

First, an operation in a segment between A and B in FIG. 2 will be described. In the segment between A and B shown in FIG. 2, a collector voltage is applied to the collector of the NPN bipolar transistor Q that includes the electrostatic protection element CB by the plus surge charge entering the input terminal. Here, FIG. 3A is a diagram for explaining a circuit operation of the electrostatic protection element CB in the segment between A and B shown in FIG. 2. In the NPN bipolar transistor Q, a pn junction is formed between the collector (n-type semiconductor region) and the base (p-type semiconductor region) and a reverse bias is applied to the pn junction when the plus surge charge is applied to the collector. However, as shown in FIG. 3, the collector voltage is smaller than a reverse junction breakdown voltage of the pn junction, so that no leakage current occurs in the pn junction. The collector voltage at this time needs to be higher than a voltage used by a product. This is because if the collector voltage in the segment between A and B is lower than the voltage used by a product, a leakage current occurs when the voltage used by a product is applied to the input terminal.

(2) Operation in a Segment Between B and C in FIG. 2

Subsequently, an operation in a segment between B and C in FIG. 2 will be described. In the segment between B and C shown in FIG. 2, the plus surge charge is more accumulated at the input terminal than in the segment between A and B shown in FIG. 2. As a result, a large collector voltage is applied to the collector of the NPN bipolar transistor Q that includes the electrostatic protection element CB. FIG. 3B is a diagram for explaining a circuit operation of the electrostatic protection element CB in the segment between B and C shown in FIG. 2. Also in this case, a reverse bias is applied to the pn junction formed by the collector and the base of the NPN bipolar transistor Q. Here, as shown in FIG. 3B, the collector voltage is greater than the reverse junction breakdown voltage of the pn junction. As a result, the pn junction is broken down, and thereby a leakage current occurs between the collector and the base. The leakage current flows in a route of collector→base→resistor R→ground.

(3) Operation in a Segment Between C and D in FIG. 2

Next, an operation in a segment between C and D in FIG. 2 will be described. As shown in FIG. 3B, the leakage current flows in the route of the collector of the NPN bipolar transistor Q→the base→the resistor R→the ground. As a result, the voltage of the resistor R drops. As a result, a potential difference occurs between the emitter and the base of the NPN bipolar transistor Q. Specifically, a base voltage applied to the base of the NPN bipolar transistor Q becomes higher than an emitter voltage applied to the emitter of the NPN bipolar transistor Q. Thereby, as shown in FIG. 3C, a forward bias is applied to the pn junction between the base (p-type semiconductor region) and the emitter (n-type semiconductor region) of the NPN bipolar transistor Q, and a current flows from the base to the emitter of the NPN bipolar transistor Q. A point at which a current starts to flow in a route of the collector of the NPN bipolar transistor Q→the base→the emitter→the ground in this way is a point C shown in FIG. 2, and thereafter the collector voltage drops. This is because a current path of collector→base→emitter→ground shown in FIG. 3C has a resistance lower than that of a current path of collector→base→resistor R→ground shown in FIG. 3B.

(4) Operation in a Segment Between D and E in FIG. 2

Subsequently, an operation in a segment between D and E in FIG. 2 will be described. As shown in FIG. 3C, a current flows in the route of the collector of the NPN bipolar transistor Q→the base→the emitter→the ground. As a result, the NPN bipolar transistor Q turns on. Thereby, as shown in FIG. 3D, a large current flows from the collector to the emitter of the NPN bipolar transistor Q. Thereby, according to the electrostatic protection element CB of the first embodiment, it possible to flow the plus surge charge entering the input terminal IN to the ground terminal GND.

A point E in FIG. 2 is a point over which a current cannot be flown as a result that any part of the electrostatic protection element CB is broken by a large current flowing from the collector to the emitter, and the point E indicates an allowable current ability (an ability to flow a current) of the electrostatic protection element CB. In other words, when the amount of current when the plus surge charge that has entered the input terminal IN is flown to the ground terminal GND is within a range of the allowable current ability of the electrostatic protection element CB, it is possible to flow the plus charge that has entered the input terminal IN to the ground terminal GND without breaking the electrostatic protection element CB. On the other hand, when the amount of current when the plus charge that has entered the input terminal IN is flown to the ground terminal GND exceeds the range of the allowable current ability of the electrostatic protection element CB, the point E shown in FIG. 2 is reached and the electrostatic protection element CB is broken. Therefore, the electrostatic breakdown resistance of the electrostatic protection element CB is determined based on the point E shown in FIG. 2.

In the operation described above, a case in which the plus surge charge is applied to the input terminal IN is described. However, for example, when a minus surge charge is applied to the input terminal IN, the electrostatic protection element CB operates as described below. For example, when a minus surge charge is applied to the collector of the NPN bipolar transistor Q in FIG. 3B, a forward bias is applied to the pn junction between the collector and the base of the NPN bipolar transistor Q. As a result, the minus surge charge flows from the collector to the base of the NPN bipolar transistor Q and then flows to the ground terminal GND through the resistor R. Thereby, according to the electrostatic protection element CB of the first embodiment, even when a minus surge charge enters the input terminal IN, the minus surge charge can be flown to the ground terminal GND.

<Characteristics Required by Electrostatic Protection Element>

Regarding the electrostatic protection element CB, for example, when the amount of surge charge which causes the collector voltage (surge voltage) to be higher than a voltage used by a product enters the input terminal IN, it is important to turn on the NPN bipolar transistor Q that includes the electrostatic protection element CB in a state in which the amount of accumulated surge charge is as small as possible and causes the surge charge accumulated in the collector (input terminal IN) to flow to the ground terminal GND by a large current that flows from the collector to the emitter of the NPN bipolar transistor Q. This is because when the NPN bipolar transistor Q that includes the electrostatic protection element CB does not turn on, the amount of surge charge flowing from the collector to the ground terminal GND is small, so that the surge charge is accumulated in the input terminal IN, and thereby there is a risk that the input transistor Tr (see FIG. 1) coupled to the input terminal IN is broken by a large collector voltage (surge voltage) caused by the surge charge.

Therefore, in the electrostatic protection element CB, it is important to turn on the NPN bipolar transistor Q that includes the electrostatic protection element CB in a state in which the amount of accumulated surge charge is as small as possible. This means that it is important to change the state shown in FIG. 3B to the state shown in FIG. 3C even when the amount of surge charge is small. In other words, it is important to cause the electrostatic protection element CB to snap back even when the amount of surge charge is as small as possible.

Here, in a state shown in FIG. 3B, when a voltage determined by a product of a resistance value of the resistor R and a current value of a leakage current flowing through the resistor R reaches a snapback voltage, the state proceeds to a state of FIG. 3C. At this time, for example, if the resistance value of the resistor R is small even when the current value of the leakage current is increased, the voltage determined by the product of the resistance value of the resistor R and the current value of the leakage current flowing through the resistor R becomes smaller than the snapback voltage (a voltage between the base and the emitter when the NPN bipolar transistor Q turns on, in other words, a built-in potential between the base and the emitter of the NPN bipolar transistor Q). In other words, even when the current value of the leakage current is increased, if the resistance value of the resistor R is small, the NPN bipolar transistor Q does not turn on and the surge charge does not flow efficiently from the input terminal IN to the ground terminal GND. As a result, there is a risk that the input transistor Tr coupled to the input terminal IN is broken by a large collector voltage (surge voltage) caused by the surge charge accumulated in the input terminal IN.

On the other hand, even when the current value of the leakage current is not so large, if the resistance value of the resistor R is large, the voltage determined by the product of the resistance value of the resistor R and the current value of the leakage current flowing through the resistor R reaches the snapback voltage. Therefore, to cause the voltage determined by the product of the resistance value of the resistor R and the current value of the leakage current flowing through the resistor R to reach the snapback voltage, it is necessary to adjust each of the resistance value of the resistor R and the current value of the leakage current flowing through the resistor R in a good balance.

For example, in a semiconductor device, to realize an electrostatic protection element CB that easily snaps back, it may be required to perform design change regarding the resistance value of the resister R and the current value of the leakage current flowing through the resistor R. In this case, much labor and time are required to design again the electrostatic protection element from the beginning, so that a structure of an electrostatic protection element that easily snaps back is desired with a required minimum design change.

Therefore, in the description below, first, a device structure of an electrostatic protection element CB1 according to a related art will be described. It will be described that in the related art, there is a room for improvement from a viewpoint of performing design change related to the resistance value of the resister R and the current value of the leakage current flowing through the resistor R to realize an electrostatic protection element CB that easily snaps back. Thereafter, a technical idea of the first embodiment in which improvement is applied to the room for improvement in the related art will be described.

<Description of Related Art>

The "relate art" in the present specification is a technique having a problem that is newly found by the inventors and is not a known related art. However, the "relate art" in the present specification is a technique described intending a premise technique (unknown technique) of new technical idea.

FIGS. 4A and 4B are diagrams showing a device structure of the electrostatic protection element CB1 according to the related art. In particular, FIG. 4A is a schematic plan view showing components formed in a semiconductor substrate among components of the electrostatic protection element CB1 according to the related art. FIG. 4B is a schematic plan view further showing not only the components formed in the semiconductor substrate among the components of the electrostatic protection element CB1 according to the related art but also components including a wiring layer formed over the semiconductor substrate.

As shown in FIG. 4A, the electrostatic protection element CB1 according to the related art is formed inside an isolation region ISO in plan view. Specifically, for example, an epitaxial layer EPI made of an n-type semiconductor layer is formed inside the isolation region ISO. Inside the epitaxial layer EPI, a collector region CR made of an n-type semiconductor region and a base region BR made of a p-type semiconductor region, which is separately facing the collector region CR, are formed. At this time, as shown in FIG. 4A, the base region BR has a protruding portion PIP extending from a portion facing the collector region. An emitter region ER made of an n-type semiconductor region is formed so as to be contained in the base region BR.

Next, as shown in FIG. 4B, in the electrostatic protection element CB1 according to the related art, a collector wiring CWL made of, for example, an aluminum wiring is formed in a position planarly overlapping with the collector region CR. The collector region CR and the collector wiring CWL are electrically coupled together by a plurality of plugs PLG1 arranged at equal intervals. The collector wiring CWL is electrically coupled with, for example, the input terminal IN shown in FIG. 1.

The base region BR arranged in a position separately facing the collector region CR has a side S1. The side S1 includes a facing portion FP facing the collector region CR. The facing portion FP of the side S1 is a boundary line of a pn junction between the base region BR and the epitaxial layer EPI. For example, when a plus surge charge enters the input terminal IN electrically coupled to the collector wiring CWL and thereby a voltage greater than or equal to the reverse junction breakdown voltage is applied between the collector region CR and the base region BR, a leakage current occurs at the pn junction of the facing portion FP.

Subsequently, in plan view, the emitter region ER is formed in a position contained in the base region BR. An emitter wiring EWL made of, for example, an aluminum wiring is formed in a position planarly overlapping with the emitter region ER and partially overlapping with the base region BR. The emitter wiring EWL is electrically coupled with the emitter region ER by a plurality of plugs PLG2 arranged at equal intervals and is also electrically coupled with the base region BR by a plurality of plugs PLG3. Further, the emitter wiring EWL is electrically coupled with, for example, the ground terminal GND shown in FIG. 1. Here, as shown in FIG. 4B, a region filled with oblique lines in the base region BR functions as a resistance region RR1. Therefore, in the electrostatic protection element CB1 according to the related art, the emitter region ER and the base region BR are electrically coupled together through the resistance region RR1.

In FIG. 4B, the leakage current shown in FIG. 3B flows in a current path of (input terminal IN)→collector wiring CWL→plug PLG1→collector region CR→epitaxial layer EPI→facing portion FP→base region BR→resistance region RR1→plug PLG3→emitter wiring EWL→(ground terminal GND).

Figure 5:
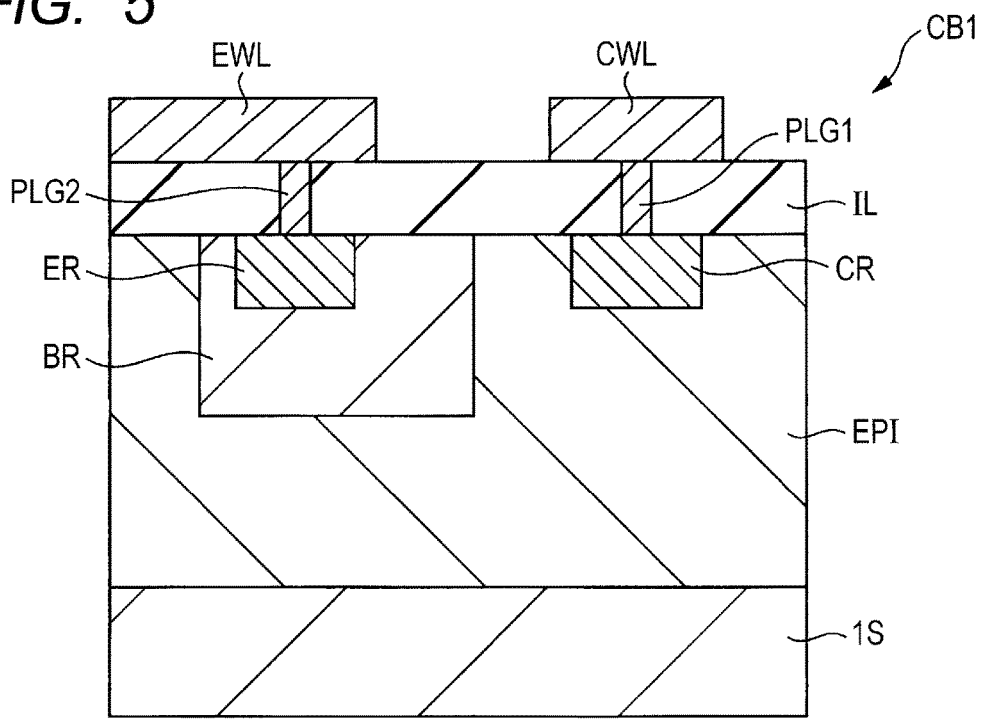
FIG. 5 is a cross-sectional view taken along line A-A in FIG. 4B.

Next, FIG. 5 is a cross-sectional view taken along line A-A in FIG. 4B. As shown in FIG. 5, the epitaxial layer EPI is formed over a semiconductor substrate 1S and the collector region CR is formed in a part of a surface region of the epitaxial layer EPI. In the epitaxial layer EPI, the base region BR is formed in a part of the surface region separated from the collector region CR and the emitter region ER is formed so as to be contained in the base region BR.

An interlayer insulating film IL made of, for example, a silicon oxide film is formed over the epitaxial layer EPI. In the interlayer insulating film IL, the plug PLG1 that penetrates the interlayer insulating film IL and reaches the collector region CR is formed, and the plug PLG2 that penetrates the interlayer insulating film IL and reaches the emitter region ER is formed. Further, over the interlayer insulating film IL, the collector wiring CWL and the emitter wiring EWL are formed. The collector wiring CWL is electrically coupled with the collector region CR through the plug PLG1. On the other hand, the emitter wiring EWL is electrically coupled with the emitter region ER through the plug PLG2.

Figure 6:
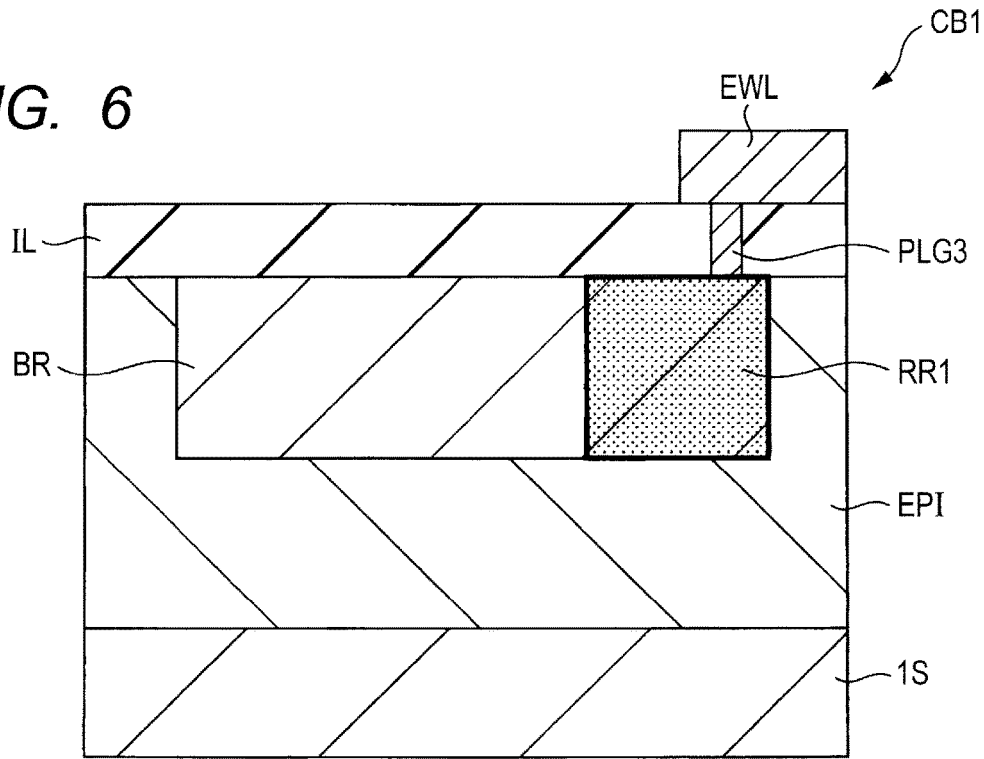
FIG. 6 is a cross-sectional view taken along line B-B in FIG. 4B.

Subsequently, FIG. 6 is a cross-sectional view taken along line B-B in FIG. 4B. As shown in FIG. 6, the base region BR is formed in a part of the surface region of the epitaxial layer EPI formed over the semiconductor substrate 1S. The interlayer insulating film IL is formed over the epitaxial layer EPI in which the base region BR is formed. In the interlayer insulating film IL, the plug PLG3 that penetrates the interlayer insulating film IL is formed. Over the interlayer insulating film IL, the emitter wiring EWL is formed. The emitter wiring EWL is electrically coupled with the base region BR through the plug PLG3. At this time, a region (a region filled with dots) formed in a position near the plug PLG3 functions as the resistance region RR1. In the way described above, the electrostatic protection element CB1 according to the related art is formed.

<Study for Improvement>

The inventors have studied the electrostatic protection element CB1 according to the related art from a viewpoint of realizing a structure of an electrostatic protection element that easily snaps back with a required minimum design change. As a result, it becomes clear that the electrostatic protection element CB1 according to the related art has a room for improvement, so that the room for improvement will be described.

For example, to cause the electrostatic protection element CB1 to easily snap back is the same as to be able to change the state shown in FIG. 3B to the state shown in FIG. 3C. In FIG. 3B, to cause the voltage determined by the product of the resistance value of the resistor R and the current value of the leakage current flowing through the resistor R to easily reach the snapback voltage, it is necessary to adjust each of the resistance value of the resistor R and the current value of the leakage current flowing through the resistor R.

In this regard, in FIG. 4B that shows the device structure of the electrostatic protection element CB1 according to the related art, the leakage current shown in FIG. 3B flows in a current path of (input terminal IN)→collector wiring CWL→plug PLG1→collector region CR→epitaxial layer EPI→facing portion FP→base region BR→resistance region RR1→plug PLG3→emitter wiring EWL→(ground terminal GND). Here, to cause the voltage determined by the product of the resistance value of the resistor R and the current value of the leakage current flowing through the resistor R to easily reach the snapback voltage, first, it is considered to increase the current value of the leakage current. However, for example, as shown in FIG. 4B, in the related art, the entire facing portion FP of the base region BR facing the collector region CR has been used as a portion where the leakage current occurs, so that it is difficult to further increase the leakage current. Therefore, the next idea is to increase the resistance value of the resistor R. However, this means that the size of the resistance region RR1 shown in FIG. 4B is increased. This means that the size of the protruding portion PTP of the base region BR shown in FIG. 4A is increased. In this case, the size of the electrostatic protection element CB1 according to the related art is increased. For example, the electrostatic protection element CB1 itself is an element irrelevant to a product operation of the semiconductor device itself, so that a design change that increases the size of the electrostatic protection element CB1 should be avoided because it is desired that the electrostatic protection element CB1 has a required minimum occupancy area.

Further, changing the size of the base region BR itself means that a design of a semiconductor area that is formed into a semiconductor substrate must be changed from the beginning, so that much labor and time are required. Therefore, in the related art, from a viewpoint of improving the performance of the electrostatic protection element CB1, when making a design change to cause the voltage determined by the product of the resistance value of the resistor R and the current value of the leakage current flowing through the resistor R to easily reach the snapback voltage, the means that can be currently employed have a disadvantage of increasing the size of the electrostatic protection element CB1 and a disadvantage of requiring much labor and time for the design change. In other words, in the related art, there is a room for improvement that it is difficult to improve the performance of the electrostatic protection element CB1 without causing a disadvantage of increasing the size of the electrostatic protection element CB1 and a disadvantage of requiring much labor and time for the design change.

Therefore, in the first embodiment, improvement is applied to the room for improvement in the related art. Hereinafter, a technical idea of the first embodiment where the improvement is applied will be described with reference to the drawings.

<Device Structure of Electrostatic Protection Element>

Figure 7A:
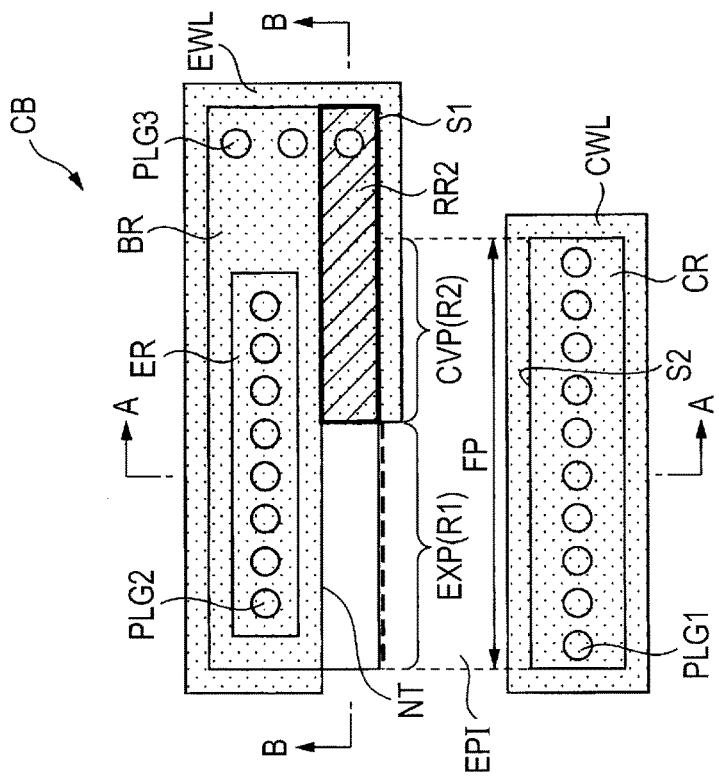
FIG. 7A is a schematic plan view showing components formed in a semiconductor substrate among components of the electrostatic protection element according to the first embodiment.
Figure 7B:
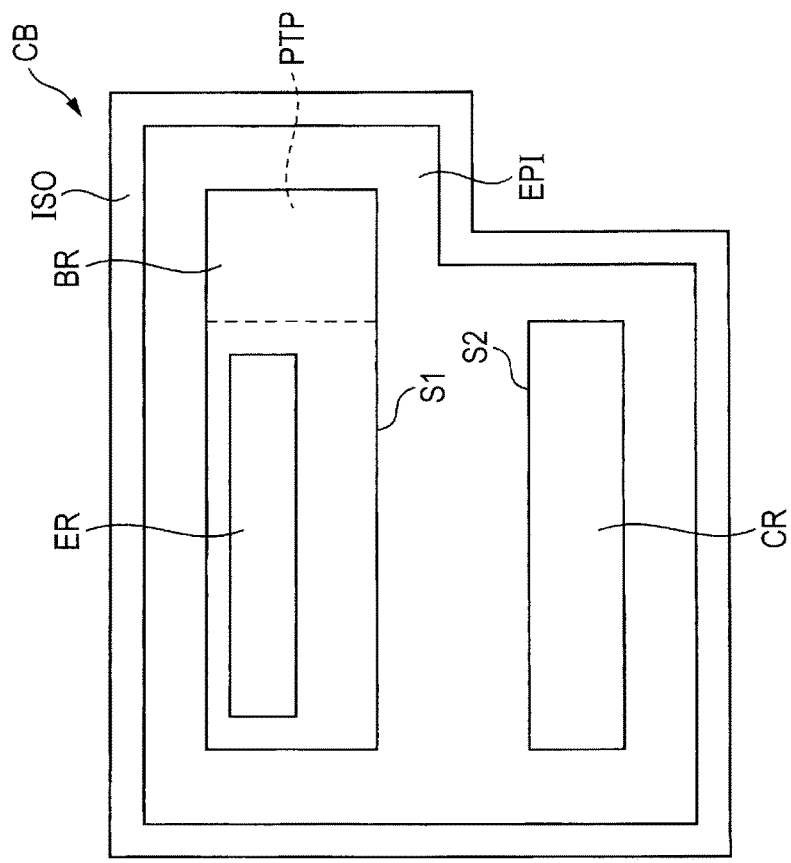
FIG. 7B is a schematic plan view showing components including also a wiring layer formed over the semiconductor substrate.

FIGS. 7A and 7B are diagrams showing a device structure of the electrostatic protection element CB according to the first embodiment. In particular, FIG. 7A is a schematic plan view showing components formed in a semiconductor substrate among components of the electrostatic protection element CB according to the first embodiment. FIG. 7B is a schematic plan view showing components including also a wiring layer formed over the semiconductor substrate among the components of the electrostatic protection element CB according to the first embodiment.

As shown in FIG. 7A, the electrostatic protection element CB according to the first embodiment is formed inside an isolation region ISO in plan view. Specifically, for example, an epitaxial layer EPI made of an n-type semiconductor layer is formed inside the isolation region ISO. Inside the epitaxial layer EPI, a collector region CR made of an n-type semiconductor region and a base region BR made of a p-type semiconductor region, which is separately facing the collector region CR, are formed. At this time, as shown in FIG. 7A, the base region BR has a protruding portion PTP extending from a portion facing the collector region. An emitter region ER made of an n-type semiconductor region is formed so as to be contained in the base region BR.

Next, as shown in FIG. 7B, in the electrostatic protection element CB according to the first embodiment, a collector wiring CWL made of, for example, an aluminum wiring is formed in a position planarly overlapping with the collector region CR. The collector region CR and the collector wiring CWL are electrically coupled together by a plurality of plugs PLG1 arranged at equal intervals. The collector wiring CWL is electrically coupled with, for example, the input terminal IN shown in FIG. 1.

Subsequently, as shown in FIG. 7B, in plan view, the emitter region ER is formed in a position contained in the base region BR. An emitter wiring EWL made of, for example, an aluminum wiring is formed in a position planarly overlapping with the emitter region ER and partially overlapping with the base region BR. The emitter wiring EWL is electrically coupled with the emitter region ER by a plurality of plugs PLG2 arranged at equal intervals and is also electrically coupled with the base region BR by a plurality of plugs PLG3. Further, the emitter wiring EWL is electrically coupled with, for example, the ground terminal GND shown in FIG. 1.

Here, the base region BR arranged in a position separately facing the collector region CR has a side S1. The side S1 includes a facing portion FP facing the collector region CR. In other words, as shown in FIG. 7B, the side S1 of the base region BR includes the facing portion FP facing the collector region CR. In the first embodiment, the facing portion FP includes an exposed portion EXP that is exposed from the emitter wiring EWL and a covered portion CVP that is covered by the emitter wiring EWL. The side S1 of the base region BR includes one end portion covered by the emitter wiring EWL in plan view and the other end portion exposed from the emitter wiring EWL in plan view. A plug PLG3 that electrically couples the base region BR and the emitter region EWL together is formed in an end portion region of the base region BR including the one end portion of the side S1.

Next, as shown in FIG. 7B, a notch portion NT is formed in the emitter wiring EWL and the exposed portion EXP is exposed from the notch portion NT provided in the emitter wiring EWL. On the other hand, the covered portion CVP is covered by the emitter wiring EWL and functions as a field plate portion. Specifically, the side S1 of the base region BR forms a boundary line of a pn junction and the breakdown voltage of the exposed portion EXP is lower than the breakdown voltage of the covered portion CVP. In other words, the breakdown voltage of the covered portion CVP is higher than the breakdown voltage of the exposed portion EXP.

As a result, in the electrostatic protection element CB according to the first embodiment, for example, when a plus surge charge enters the input terminal IN electrically coupled to the collector wiring CWL and thereby a voltage greater than or equal to the reverse junction breakdown voltage is applied between the collector region CR (epitaxial layer EPI) and the base region BR, a leakage current occurs at the pn junction of the exposed portion EXP of the facing portion FP. As a result, a region R1 of the base region BR which includes the exposed portion EXP functions as a leakage current generation region and a region R2 including the covered portion CVP functions as a resistance region RR2. Further, a region filled with oblique lines in the base region BR functions as a resistance region RR2. Therefore, in the electrostatic protection element CB according to the first embodiment, the emitter region ER and the base region BR are electrically coupled together through the resistance region RR2. As a result, in FIG. 7B, the leakage current shown in FIG. 3B flows in a current path of (input terminal IN)→collector wiring CWL→plug PLG1→collector region CR→epitaxial layer EPI→exposed portion EXP→base region BR→resistance region RR2 including the covered portion CVP→plug PLG3→emitter wiring EWL→(ground terminal GND).

In summary, the electrostatic protection element CB according to the first embodiment includes a bipolar transistor where the base region BR and the emitter region ER are electrically coupled together through the resistance region RR2. In particular, the electrostatic protection element CB according to the first embodiment has the base region BR formed in the epitaxial layer EPI, the emitter region ER which is formed in the epitaxial layer EPI and contained in the base region BR in plan view, and the collector region CR which is formed in the epitaxial layer EPI and separately arranged from the base region BR in plan view. Further, the electrostatic protection element CB according to the first embodiment includes the emitter wiring EWL which is electrically coupled with each of the base region BR and the emitter region ER and partially overlapped with the base region BR in plan view. At this time, the base region BR has the side S1 including the facing portion FP facing the collector region CR, and the facing portion FP of the side S1 is formed of the exposed portion EXP that is exposed from the emitter wiring EWL in plan view and the covered portion CVP that is covered by the emitter wiring EWL in plan view.

Figure 8:
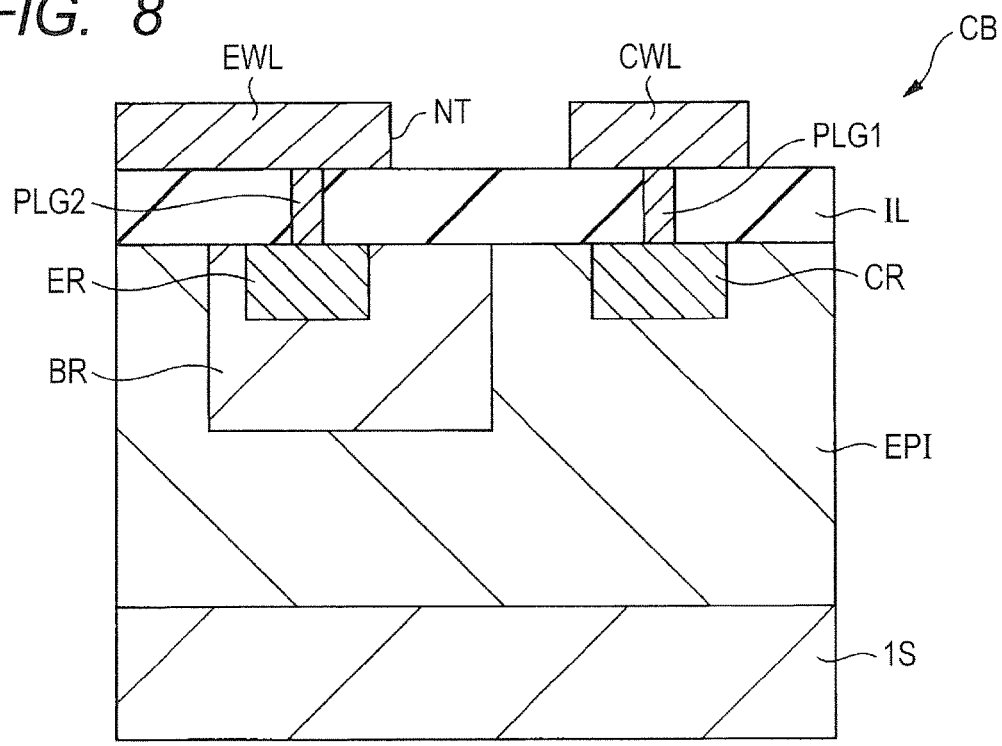
FIG. 8 is a cross-sectional view taken along line A-A in FIG. 7B.

Next, FIG. 8 is a cross-sectional view taken along line A-A in FIG. 7B.

As shown in FIG. 8, the epitaxial layer EPI made of an n-type semiconductor layer is formed over the semiconductor substrate 1S, and the collector region CR made of an n-type semiconductor region is formed in a part of the surface region of the epitaxial layer EPI. In the epitaxial layer EPI, the base region BR made of a p-type semiconductor region is formed in a part of the surface region separated from the collector region CR, and the emitter region ER made of an n-type semiconductor region is formed so as to be contained in the base region BR.

An interlayer insulating film IL made of, for example, a silicon oxide film is formed over the epitaxial layer EPI. In the interlayer insulating film IL, the plug PLG1 that penetrates the interlayer insulating film IL and reaches the collector region CR is formed, and the plug PLG2 that penetrates the interlayer insulating film IL and reaches the emitter region ER is formed. Further, over the interlayer insulating film IL, the collector wiring CWL and the emitter wiring EWL are formed. The collector wiring CWL is electrically coupled with the collector region CR through the plug PLG1. On the other hand, the emitter wiring EWL is electrically coupled with the emitter region ER through the plug PLG2. The notch portion NT is formed at an end portion of the emitter wiring EWL and a part of the base region BR is exposed from the emitter wiring EWL.

Figure 9:
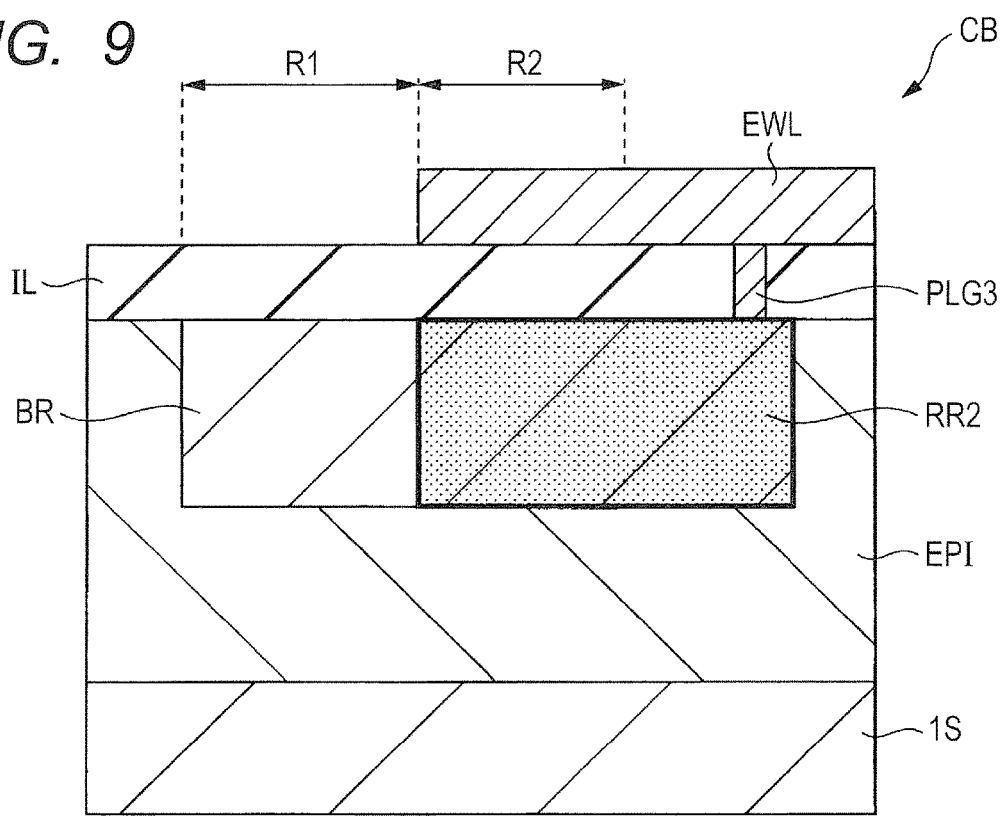
FIG. 9 is a cross-sectional view taken along line B-B in FIG. 7B.

Subsequently, FIG. 9 is a cross-sectional view taken along line B-B in FIG. 7B.

As shown in FIG. 9, the base region BR is formed in a part of the surface region of the epitaxial layer EPI formed over the semiconductor substrate 1S. The interlayer insulating film IL is formed over the epitaxial layer EPI in which the base region BR is formed. In the interlayer insulating film IL, the plug PLG3 that penetrates the interlayer insulating film IL is formed. Over the interlayer insulating film IL, the emitter wiring EWL is formed. The emitter wiring EWL is electrically coupled with the base region BR through the plug PLG3. At this time, the base region BR has the region R1 exposed from the emitter wiring EWL and the region R2 covered by the emitter wiring EWL, and a region (a region filled with dots) which includes the region R2 of the base region BR and is formed in a position close to the plug PLG3 functions as the resistance region RR2. In the way described above, the electrostatic protection element CB according to the first embodiment is formed.

Characteristic of First Embodiment

Next, a characteristic point of the first embodiment will be described. The characteristic point of the first embodiment is, for example, as shown in FIG. 7B, to provide the exposed portion EXP that is exposed from the emitter wiring EWL and the covered portion CVP that is covered by the emitter wiring EWL in the facing portion FP of the base region BR facing the collector region CR. Thereby, according to the electrostatic protection element CB of the first embodiment, it is possible to cause the voltage determined by the product of the resistance value of the resistor R and the current value of the leakage current flowing through the resistor R (see FIG. 3B) to easily reach the snapback voltage. Thereby, it is possible to improve the performance of the electrostatic protection element CB.

Hereinafter, the point that it is possible to cause the voltage determined by the product of the resistance value of the resistor R and the current value of the leakage current flowing through the resistor R (see FIG. 3B) to easily reach the snapback voltage according to the characteristic point of the first embodiment will be described.

First, the collector region CR is formed of an n-type semiconductor region and the epitaxial layer EPI is also formed of an n-type semiconductor layer. On the other hand, the base region BR is formed of a p-type semiconductor region. Thus, in FIG. 7B, a pn junction is formed at the side S1 of the base region BR that is in contact with the epitaxial layer EPI. In particular, when focusing on the facing portion FP facing the collector region CR, both of the exposed portion EXP and the covered portion CVP of the facing portion FP form the boundary line of the pn junction.

At this time, the reverse junction breakdown voltage of the covered portion CVP is higher than that of the exposed portion EXP. The reason of this will be described below.

For example, the collector wiring CWL shown in FIG. 7B is coupled with the input terminal IN shown in FIG. 1 and it is assumed that a plus surge charge enters the input terminal IN. In this case, a positive potential is applied to the collector region (n-type semiconductor region) CR that is electrically coupled with the collector wiring CWL. A positive potential is also applied to the epitaxial layer EPI formed of a semiconductor layer having the same conductivity type as that of the collector region CR. On the other hand, the emitter wiring EWL shown in FIG. 7B is coupled with the ground terminal GND shown in FIG. 1. As shown in FIG. 7B, the emitter wiring EWL shown in FIG. 7B is electrically coupled with the base region BR through the plug PLG3. Thus, when a plus surge charge enters the input terminal IN, a reverse bias is applied to the pn junction formed at a boundary region (the side S1) between the base region BR and the epitaxial layer EPI. As a result, a depletion layer extending toward the epitaxial layer EPI and a depletion layer extending toward the base region BR are formed from both of the exposed portion EXP and the covered portion CVP that form the facing portion FP of the side S1.

Here, the width of the depletion layer extending toward the epitaxial layer EPI from the covered portion CVP is greater than the width of the depletion layer extending toward the epitaxial layer EPI from the exposed portion EXP. This is because a planar overlapping portion is formed between the emitter wiring EWL and the epitaxial layer EPI in the covered portion CVP covered by the emitter wiring EWL as shown in FIG. 7B. Specifically, the emitter wiring EWL is coupled to the ground terminal GND, so that a relatively negative potential is applied to the emitter wiring EWL with respect to the epitaxial layer EPI to which a positive potential is applied. In this case, electrons present in the epitaxial layer EPI planarly overlapping with the emitter wiring EWL are brought away from the emitter wiring EWL by the relative negative potential applied to the emitter wiring EWL. This means that the depletion layer extends into the epitaxial layer EPI planarly overlapping with the emitter wiring EWL. That is, in the covered portion CVP, the depletion layer extends into the epitaxial layer EPI planarly overlapping with the emitter wiring EWL, so that the width of the depletion layer extending toward the epitaxial layer EPI from the covered portion CVP is greater than the width of the depletion layer extending toward the epitaxial layer EPI from the exposed portion EXP that does not planarly overlap with the emitter wiring EWL. When the width of the depletion layer becomes large, the reverse junction breakdown voltage of the pn junction becomes large, so that the reverse junction breakdown voltage of the covered portion CVP becomes higher than that of the exposed portion EXP according to the characteristic point of the first embodiment.

Thereby, according to the electrostatic protection element CB of the first embodiment, the pn junction of the exposed portion EXP is broken down by a reverse bias lower than that of the pn junction of the covered portion CVP. This means that only the exposed portion EXP functions as a current path of leakage current. Specifically, although the related art shown in FIG. 4B uses the entire facing portion FP facing the collector region CR as the current path of the leakage current, the first embodiment uses only the exposed portion EXP of the facing portion FP facing the collector region CR as the current path of the leakage current as shown in FIG. 7B. In other words, in the first embodiment, the covered portion CVP of the facing portion FP facing the collector region CR is used as a part of the resistance region RR2 instead of the current path of the leakage current.

Thereby, according to the electrostatic protection element CB of the first embodiment, it is possible to adjust each of the resistance value of the resistor R and the current value of the leakage current flowing through the resistor R in a good balance. As a result, it is possible to cause the voltage determined by the product of the resistance value of the resistor R and the current value of the leakage current flowing through the resistor R to easily reach the snapback voltage. In this way, according to the electrostatic protection element CB of the first embodiment, it is possible to improve performance. In other words, the technical idea of the first embodiment is not an idea of using the entire facing portion FP facing the collector region CR as the current path of the leakage current as in the related art shown in FIG. 4B, but a technical idea of providing a portion used as the current path of the leakage current and a portion used as a part of the resistance region in the facing portion FP facing the collector region CR. The technical idea of the first embodiment is embodied as the characteristic point of the first embodiment in which a portion with a high reverse junction breakdown voltage and a portion with a low reverse junction breakdown voltage are intentionally provided in the facing portion FP facing the collector region CR and thereby the portion with a high reverse junction breakdown voltage is used as a part of the resistance region RR2 and the portion with a low reverse junction breakdown voltage is used as the current path of the leakage current. Specifically, in the first embodiment, as shown in FIG. 7B, a portion with a high reverse junction breakdown voltage and a portion with a low reverse junction breakdown voltage are intentionally provided in the facing portion FP facing the collector region CR by forming the exposed portion EXP that is exposed from the emitter wiring EWL and the covered portion CVP that is covered by the emitter wiring EWL. In this case, according to the characteristic point of the first embodiment, it is possible to adjust each of the resistance value of the resistor R and the current value of the leakage current flowing through the resistor R in a good balance by well adjusting a ratio between the exposed portion EXP and the covered portion CVP. As a result, according to the characteristic point of the first embodiment, it is possible to cause the voltage determined by the product of the resistance value of the resistor R and the current value of the leakage current flowing through the resistor R to easily reach the snapback voltage.

The characteristic point of the first embodiment will be qualitatively described in an easily understandable way. For example, it is assumed that the snapback voltage when the state shown in FIG. 3B changes to the state shown in FIG. 3C is "60". At this time, in the related art shown in FIG. 4B, the entire facing portion FP facing the collector region CR is used as the current path of the leakage current, so that it is assumed that, for example, the resistor R is "5" and the leakage current is "10" in the state shown in FIG. 3B. In this case, in the related art, the voltage determined by the product of the current value of the leakage current and the resistance value of the resistor R is "50" which is lower than the snapback voltage ("60"), so that the electrostatic protection element does not snap back.

On the other hand, in the first embodiment shown in FIG. 7B, the current path of the leakage current is not the entire facing portion FP facing the collector region CR, but the entire exposed portion EXP. Therefore, the leakage current is smaller than that in the related art (½ of the related art). For example, the leakage current is "5". On the other hand, in the first embodiment, the covered portion CVP of the facing portion FP functions as a part of the resistance region RR2, so that the resistance value of the resistor R is greater than that in the related art (2.5 times of the related art). For example, the resistance value of the resistor R is "12.5". In this case, in the first embodiment, the voltage determined by the product of the current value of the leakage current and the resistance value of the resistor R is "62.5" which is greater than the snapback voltage "60", so that the electrostatic protection element snaps back.

In the example described above, while the voltage ("50") determined by the product of the current value of the leakage current and the resistance value of the resistor R is lower than the snapback voltage ("60") in the related art, the voltage ("62.5") determined by the product of the current value of the leakage current and the resistance value of the resistor R is higher than the snapback voltage ("60") in the first embodiment.

This means that the electrostatic protection element CB according to the first embodiment snaps back more easily than the electrostatic protection element CB1 according to the related art. That is, it is possible to improve the performance of the electrostatic protection element CB according to the characteristic point of the first embodiment.

In particular, in the first embodiment, as shown in FIG. 7B, the plug PLG3 that electrically couples the base region BR and the emitter region EWL together is arranged in an end portion region of one end portion of the base region BR covered by the emitter wiring EWL. Thereby, according to the first embodiment, due to a synergistic effect of using the covered portion CVP of the facing portion FP facing the collector region CR as a part of the resistance region RR2, it is possible to increase the resistance value of the resistance region RR2 without increasing the size of the base region BR.

Further, according to the characteristic point of the first embodiment, not only it is possible to merely improve the performance of the electrostatic protection element CB, but also it is possible to obtain a remarkable effect that it is possible to improve the performance of the electrostatic protection element CB without causing a disadvantage of increasing the size of the electrostatic protection element CB and a disadvantage of requiring much labor and time for the design change.

Hereinafter, the above remarkable effect will be described. For example, in the related art shown in FIG. 4B, it is difficult to further increase the leakage current because the entire facing portion FP of the base region BR facing the collector region CR has been used as a portion where the leakage current occurs. For this reason, in the related art, it is considered to increase the resistance value of the resistor R in order to cause the voltage determined by the product of the current value of the leakage current and the resistance value of the resistor R to easily reach the snapback voltage. However, this means that the size of the resistance region RR1 shown in FIG. 4B is increased, and this means that the size of the protruding portion PTP of the base region BR shown in FIG. 4A is increased. In this case, the size of the electrostatic protection element CB1 according to the related art increases. Further, changing the size of the base region BR itself means that a design of a semiconductor area that is formed into a semiconductor substrate must be changed from the beginning, so that much labor and time are required. Therefore, in the related art, from a viewpoint of improving the performance of the electrostatic protection element CB1, when making a design change to cause the voltage determined by the product of the resistance value of the resistor R and the current value of the leakage current flowing through the resistor R to easily reach the snapback voltage, the disadvantage of increasing the size of the electrostatic protection element CB1 and the disadvantage of requiring much labor and time for the design change become apparent.

On the other hand, in the first embodiment, as shown in FIG. 7B, the voltage determined by the product of the resistance value of the resistor R and the current value of the leakage current flowing through the resistor R is caused to easily reach the snapback voltage by forming the exposed portion EXP that is exposed from the emitter wiring EWL and the covered portion CVP that is covered by the emitter wiring EWL in the facing portion FP facing the collector region CR. Such a design change can be performed by only changing a layout pattern of the emitter wiring EWL. In other words, it is possible to adjust a ratio between the exposed portion EXP that is exposed from the emitter wiring EWL and the covered portion CVP that is covered by the emitter wiring EWL by only changing the layout pattern of the emitter wiring EWL.

This means that it is possible to increase the size of the resistance region RR2 by the covered portion CVP without increasing the size of the protruding portion PTP of the base region BR shown in FIG. 7A according to the first embodiment. Therefore, in the design change according to the first embodiment, it is not necessary to increase the size of the electrostatic protection element CB to cause the voltage determined by the product of the resistance value of the resistor R and the current value of the leakage current flowing through the resistor R to easily reach the snapback voltage. The design change according to the first embodiment can be performed by only changing the layout pattern of the emitter wiring EWL without changing the size of the base region BR formed in the semiconductor substrate. At this time, a design change of the layout pattern of the emitter wiring EWL requires less labor and time as compared with a design change of the base region BR formed in the semiconductor substrate and can be relatively easily performed.

Thus, according to the first embodiment, when making a design change to cause the voltage determined by the product of the resistance value of the resistor R and the current value of the leakage current flowing through the resistor R to easily reach the snapback voltage, it is possible to improve the performance of the electrostatic protection element CB without actualizing the disadvantage of increasing the size of the electrostatic protection element CB and the disadvantage of requiring much labor and time for the design change. As described above, it is known that the characteristic point of the first embodiment is a useful technical idea because not only it is possible to improve the performance of the electrostatic protection element CB but also it is possible to realize improvement of the performance of the electrostatic protection element CB without actualizing the disadvantages that become apparent in the technical idea of the related art.

Second Embodiment

<Device Structure of Electrostatic Protection Element>

FIGS. 10A and 10B are diagrams showing a device structure of an electrostatic protection element CB according to a second embodiment. In particular, FIG. 10A is a schematic plan view showing components formed in a semiconductor substrate among components of the electrostatic protection element CB according to the second embodiment. FIG. 10B is a schematic plan view further showing components including also a wiring layer formed over the semiconductor substrate among the components of the electrostatic protection element CB according to the second embodiment.

In FIG. 10A, the electrostatic protection element CB according to the second embodiment includes a base region BR having a side S1, an emitter region ER contained in the base region BR in plan view, and a collector region CR having a side S2 in parallel with the side S1. At this time, the length of the side S1 of the base region BR is the same as the length of the side S2 of the collector region CR.

Next, as shown in FIG. 10B, in the electrostatic protection element CB according to the second embodiment, the length of the side S1 of the base region BR is the same as the length of the side S2 of the collector region CR, so that the entire side S1 of the base region BR is a facing portion FP facing the collector region CR. The facing portion FP facing the collector region CR includes an exposed portion EXP that is exposed from an emitter wiring EWL in plan view and a covered portion CVP that is covered by the emitter wiring EWL in plan view. The electrostatic protection element CB according to the second embodiment is formed as described above.

Characteristic of Second Embodiment

Subsequently, a characteristic point of the second embodiment will be described. The characteristic point of the second embodiment is, for example, as shown in FIG. 10A, that the length of the side S1 of the base region BR is the same as the length of the side S2 of the collector region CR and the exposed portion EXP and the covered portion CVP are provided on the side S1. Thereby, according to the electrostatic protection element CB of the second embodiment, for example, it is possible to reduce a plane size of the electrostatic protection element CB to a size smaller than a plane size of the electrostatic protection element CB according to the first embodiment while maintaining the same or higher performance than that of the electrostatic protection element CB according to the first embodiment shown in FIG. 7A.

In the electrostatic protection element CB according to the second embodiment, for example, as shown in FIG. 10B, the exposed portion EXP and the covered portion CVP are formed on the side S1, a region R1 including the exposed portion EXP functions as a current path of leakage current, and a region R2 including the covered portion CVP functions as a resistance region RR3. Thus, in the electrostatic protection element CB according to the second embodiment, it is not necessary to provide the protruding portion PTP to secure the resistance region RR2 as in the electrostatic protection element CB according to the first embodiment shown in FIGS. 7A and 7B. That is, in the electrostatic protection element CB according to the second embodiment, the resistance region RR3 is secured in the region R2 that includes the covered portion CVP, so that it is possible to exert the same or higher performance than that of the electrostatic protection element CB according to the first embodiment even when the protruding portion PTP is not provided.

As a result, according to the electrostatic protection element CB of the second embodiment, it is possible to obtain a remarkable effect that the plane size of the electrostatic protection element CB can be reduced while realizing a performance higher than or equal to that of the electrostatic protection element CB of the first embodiment where the voltage determined by the product of the resistance value of the resistor R and the current value of the leakage current flowing through the resistor R (see FIG. 3B) easily reaches the snapback voltage.

<Modified Example>

Figure 11:
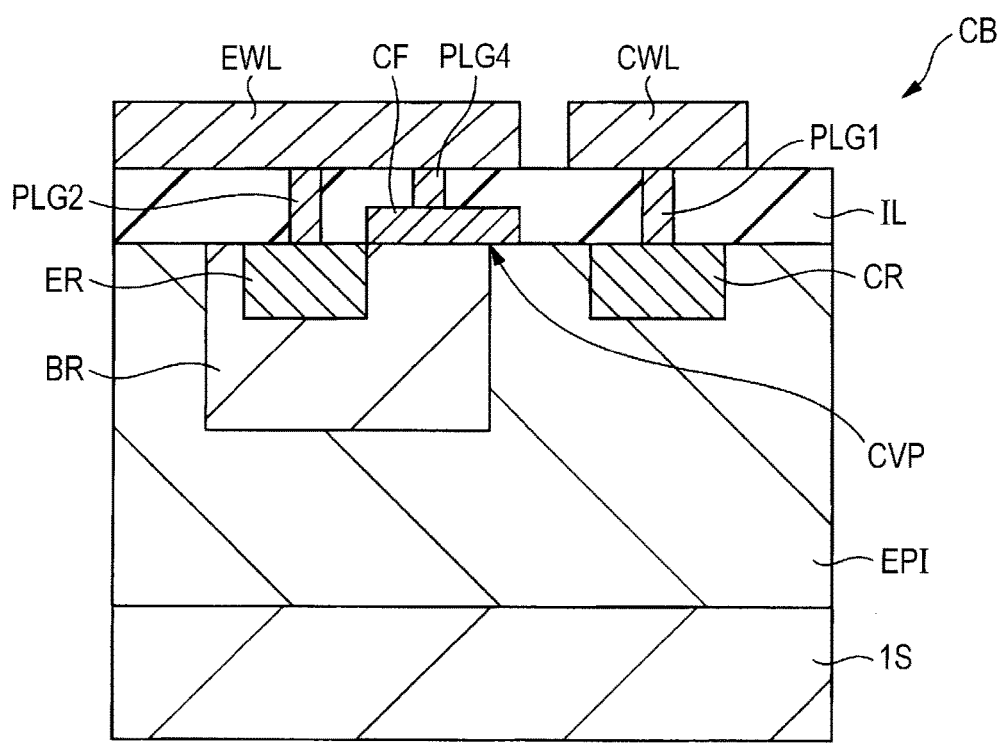
FIG. 11 is a cross-sectional view showing a schematic device structure of an electrostatic protection element according to a modified example.

Next, an electrostatic protection element CB according to a modified example will be described. FIG. 11 is a cross-sectional view showing a schematic device structure of the electrostatic protection element CB according to the modified example. As shown in FIG. 11, in the electrostatic protection element CB according to the modified example, a conductor film CF is formed between a base region BR and an emitter wiring EWL in a cross-sectional view, and a covered portion CVP is covered by the conductor film CF. At this time, the conductor film CF is formed so as to cross over a pn junction formed at a boundary region between the base region BR and an epitaxial layer EPI. The conductor film CF is electrically coupled with the emitter wiring EWL by a plug PLG4 that penetrates an interlayer insulating film IL. As a result, in the modified example, not only the emitter wiring EWL but also the conductor film CF functions as a field plate portion that increases the reverse junction breakdown voltage of the pn junction at the covered portion CVP.

In particular, in the modified example, the conductor film CF is formed so as to be directly in contact with the pn junction formed at the boundary region between the base region BR and the epitaxial layer EPI, so that it is possible to increase the width of a depletion layer extending from the conductor film CF into the epitaxial layer EPI, and thereby, according to the modified example, it is possible to increase the reverse junction breakdown voltage of the pn junction at the covered portion CVP. Further, when the conductor film CF is formed of a p-type semiconductor film represented by a p-type polysilicon film, a pn junction is formed between the conductor film CF and the epitaxial layer EPI along with the effect described above and a reverse bias is also applied to the pn junction. Therefore, it is possible to further extend the depletion layer in the epitaxial layer EPI. Thereby, according to the modified example, it is possible to increase a difference between the reverse junction breakdown voltage of the exposed portion EXP and the reverse junction breakdown voltage of the covered portion CVP. Therefore, according to the modified example, it is possible to cause the covered portion CVP to reliably function as a resistance region while the exposed portion is used as a current path of the leakage current.

While the invention made by the inventors has been specifically described based on the embodiments, it is needless to say that the present invention is not limited to the embodiments and may be variously modified without departing from the scope of the invention.

What is claimed is:
1. A semiconductor device comprising:
an electrostatic protection element including a bipolar transistor,
wherein the electrostatic protection element includes:
a base region formed in an epitaxial layer,
an emitter region which is formed in the epitaxial layer and contained in the base region in plan view,
a collector region which is formed in the epitaxial layer and separately arranged from the base region in plan view, and
an emitter wiring which is electrically coupled with each of the base region and the emitter region and partially overlapped with the base region in plan view,
wherein the base region and the emitter region are electrically coupled together through a resistance region, wherein the base region has a first side including a facing portion that faces the collector region, and
wherein the facing portion of the first side includes:
an exposed portion that is exposed from the emitter wiring in plan view, and
a covered portion that is covered by the emitter wiring in plan view.

2. The semiconductor device according to claim 1, wherein the exposed portion is exposed from a notch portion provided in the emitter wiring.

3. The semiconductor device according to claim 1, wherein the covered portion functions as a field plate portion.

4. The semiconductor device according to claim 1,
wherein the first side forms a boundary line of a pn junction, and
wherein a breakdown voltage of the exposed portion is lower than a breakdown voltage of the covered portion.

5. The semiconductor device according to claim 1, wherein the base region includes:
a first region including the exposed region, and
a second region including the covered portion,
wherein the first region functions as a leakage current generation region, and
wherein the second region functions as the resistance region.

6. The semiconductor device according to claim 1, wherein the first side includes:
a first end portion that is covered by the emitter wiring in plan view, and
a second end portion that is exposed from the emitter wiring in plan view, and
wherein a plug that electrically couples the base region and the emitter region together is formed in an end portion region of the base region including the first end portion of the first side.

7. The semiconductor device according to claim 1,
wherein the collector region has a second side in parallel with the first side of the base region, and
wherein a length of the first side of the base region is the same as a length of the second side of the collector region.

8. The semiconductor device according to claim 1,
wherein a conductor film is formed between the base region and the emitter wiring in a cross-sectional view, and
wherein the covered portion is covered by the conductor film.

9. The semiconductor device according to claim 8, wherein the conductor film is formed of a polysilicon film.

10. The semiconductor device according to claim 1,
wherein the base region is formed of a p-type semiconductor region,
wherein each of the emitter region and the collector region is formed of an n-type semiconductor region, and
wherein the epitaxial layer is formed of an n-type semiconductor layer.

11. The semiconductor device according to claim 1, further comprising:
an input terminal to which a signal is inputted;
a power supply terminal to which a power supply potential is supplied;
a ground terminal to which a reference potential is supplied; and
wherein the electrostatic protection element is coupled between the input terminal and the ground terminal.

12. The semiconductor device according to claim 11,
wherein the bipolar transistor is an NPN bipolar transistor,
wherein the collector region is electrically coupled with the input terminal, and
wherein the emitter region is electrically coupled with the ground terminal.

* * * * *